（12）United States Patent
Heinrich et al.

(10) Patent No.: US 10,014,275 B2
(45) Date of Patent: Jul. 3, 2018

(54) METHOD FOR PRODUCING A CHIP ASSEMBLAGE

(71) Applicant: Infineon Technologies AG, Neubiberg (DE)

(72) Inventors: Alexander Heinrich, Bad Abbach (DE); Irmgard Escher-Poeppel, Duggendorf (DE); Martin Gruber, Schwandorf (DE); Andreas Munding, Regensburg (DE); Catharina Wille, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/459,151

(22) Filed: Mar. 15, 2017

(65) Prior Publication Data

US 2017/0271298 A1     Sep. 21, 2017

(30) Foreign Application Priority Data

Mar. 16, 2016 (DE) .................. 10 2016 104 844

(51) Int. Cl.
*H01L 23/00* (2006.01)
*H01L 25/00* (2006.01)

(52) U.S. Cl.
CPC ............ *H01L 24/81* (2013.01); *H01L 24/09* (2013.01); *H01L 24/16* (2013.01); *H01L 24/85* (2013.01); *H01L 25/50* (2013.01); *H01L 2224/095* (2013.01); *H01L 2224/16104* (2013.01); *H01L 2224/16112* (2013.01); *H01L 2224/16137* (2013.01); *H01L 2224/4912* (2013.01)

(58) Field of Classification Search
CPC ............................ H01L 24/09; H01L 25/072
See application file for complete search history.

(56) References Cited

U.S. PATENT DOCUMENTS 9,165,871 B2    10/2015 Miyanagi
2006/0157832 A1*  7/2006 Ryu .................... H01L 23/5389
                                                       257/678
2015/0061100 A1   3/2015 Hohlfeld et al.
2017/0294409 A1* 10/2017 Yu ...................... H01L 25/0655

FOREIGN PATENT DOCUMENTS

DE    10 2013 217 801     3/2015
EP         2 722 879       4/2014

* cited by examiner

*Primary Examiner* — Mounir Amer
(74) *Attorney, Agent, or Firm* — Dicke, Billig & Czaja, PLLC

(57) ABSTRACT

One aspect of the invention relates to a method for producing a chip assemblage. Two or more chip assemblies are produced in each case by cohesively and electrically conductively connecting an electrically conductive first compensation lamina to a first main electrode of a semiconductor chip. A control electrode interconnection structure is arranged in a free space between the chip assemblies. Electrically conductive connections are produced between the control electrode interconnection structure and control electrodes of the semiconductor chips of the individual chip assemblies. The chip assemblies are cohesively connected by means of a dielectric embedding compound.

19 Claims, 16 Drawing Sheets

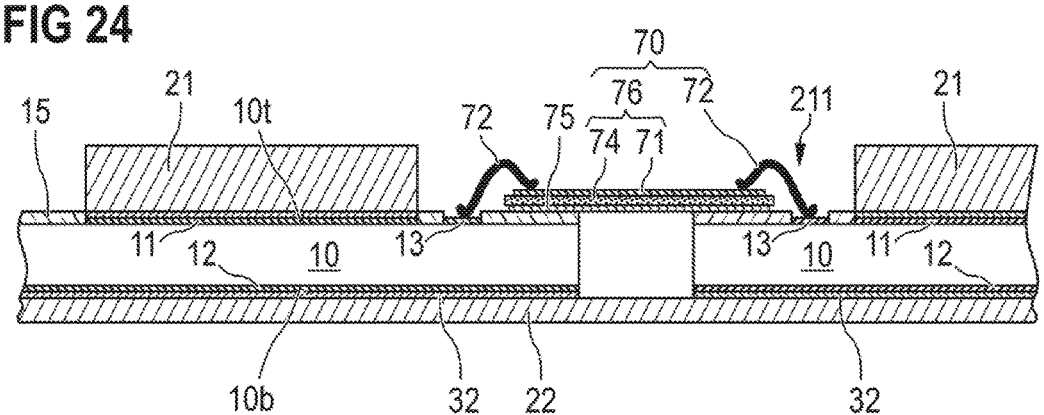
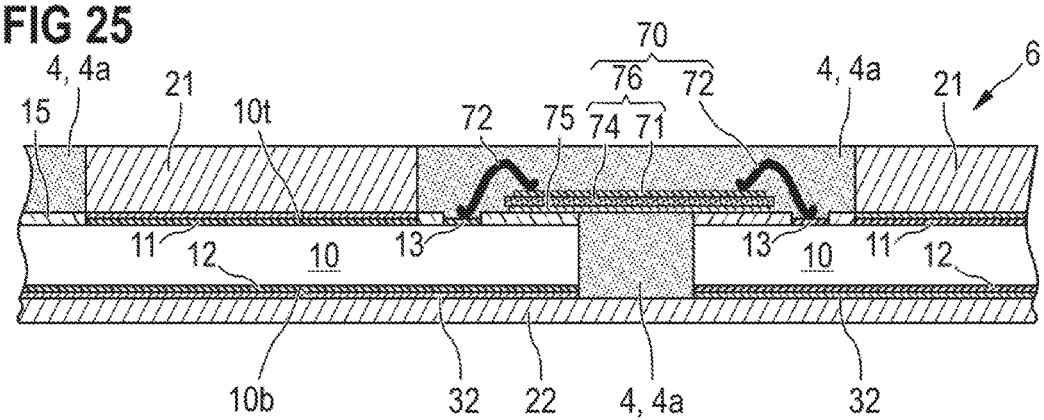

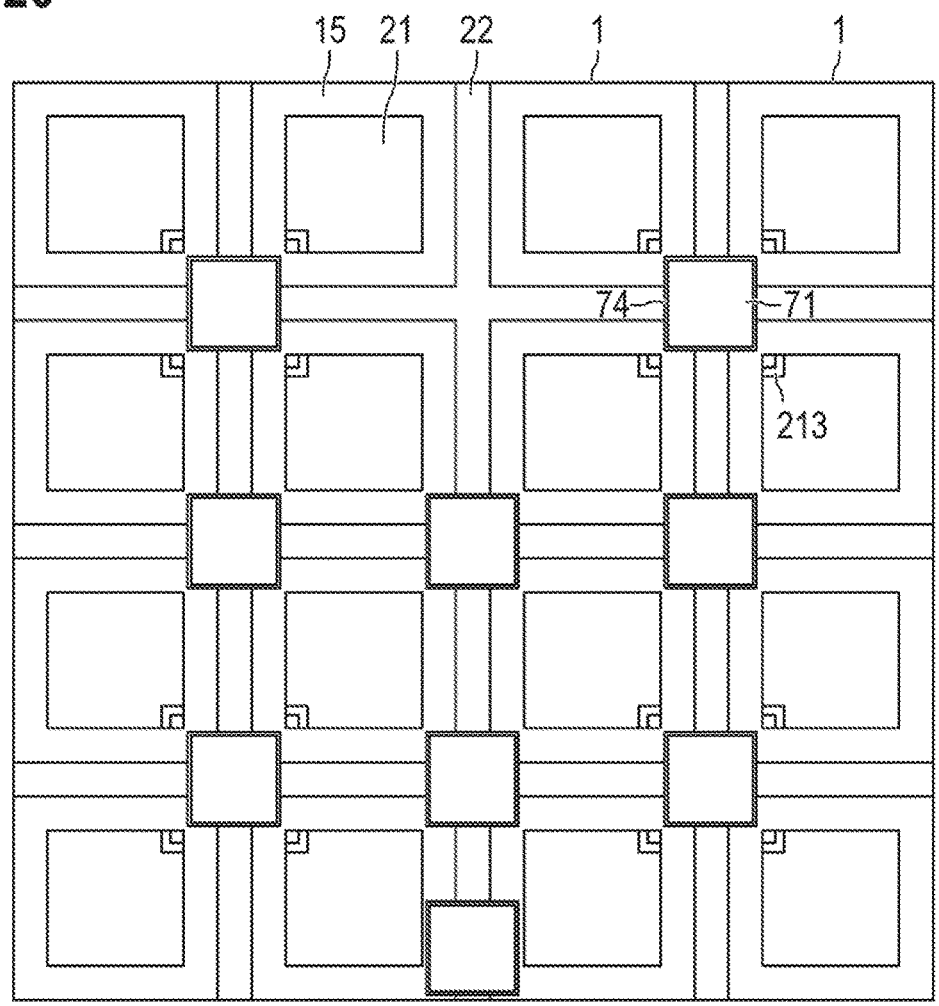

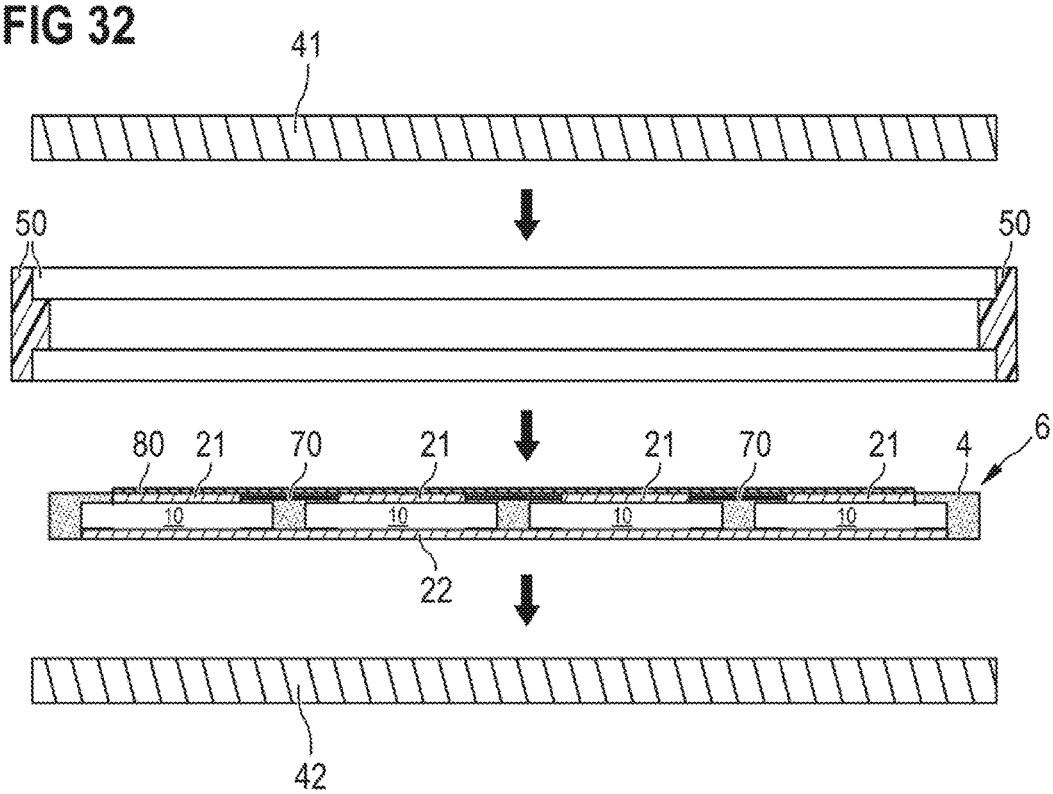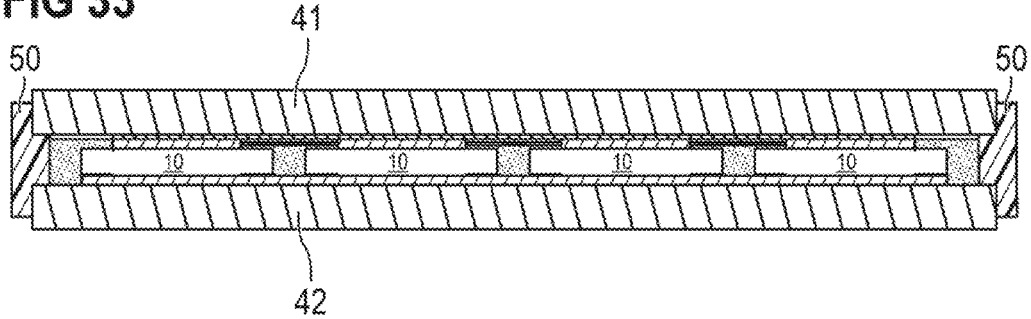

METHOD FOR PRODUCING A CHIP ASSEMBLAGE

CROSS-REFERENCE TO RELATED APPLICATION

This Utility Patent Application claims priority to German Patent Application No. 10 2016 104 844.5, filed Mar. 16, 2016; which is incorporated herein by reference.

BACKGROUND

The present invention relates to the production of a chip assemblage which can be used in a press pack cell.

Conventional press pack cells comprise a number of semiconductor chips which are pressed loosely between two electrically conductive pressure contact pieces and are electrically contacted and, if appropriate, electrically connected in parallel in the process. The handling of individual semiconductor chips is difficult, however, and it is therefore desirable to facilitate this.

One aspect of the invention relates to a method for producing a chip assemblage. In this case, two or more chip assemblies are produced in each case by cohesively and electrically conductively connecting an electrically conductive first compensation lamina to a first main electrode of a semiconductor chip. A control electrode interconnection structure is arranged in a free space between the chip assemblies. Electrically conductive connections are produced between the control electrode interconnection structure and control electrodes of the semiconductor chips of the individual chip assemblies. The chip assemblies are cohesively connected by means of a dielectric embedding compound.

BRIEF DESCRIPTION OF THE DRAWINGS

The invention is explained in greater detail below on the basis of exemplary embodiments with reference to the accompanying figures. In the figures, identical reference signs designate identical or identically acting elements. In the figures:

FIGS. 24 to 27 show different steps of a fourth example for producing a chip assemblage.

FIGS. 32 to 33 show different steps of a method for producing a press pack cell wherein a chip assemblage is arranged between two electrically conductive contact plates of a housing.

DETAILED DESCRIPTION

Figure 1:
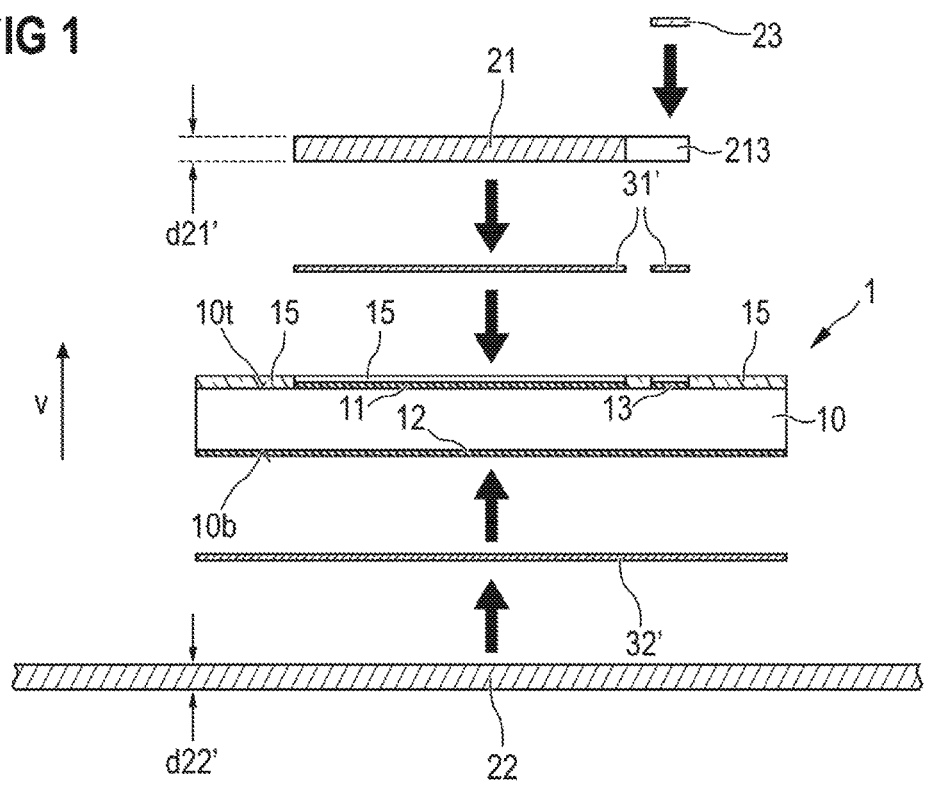
FIGS. 1 to 17 show different steps of a first example for producing a chip assemblage.
Figure 3:
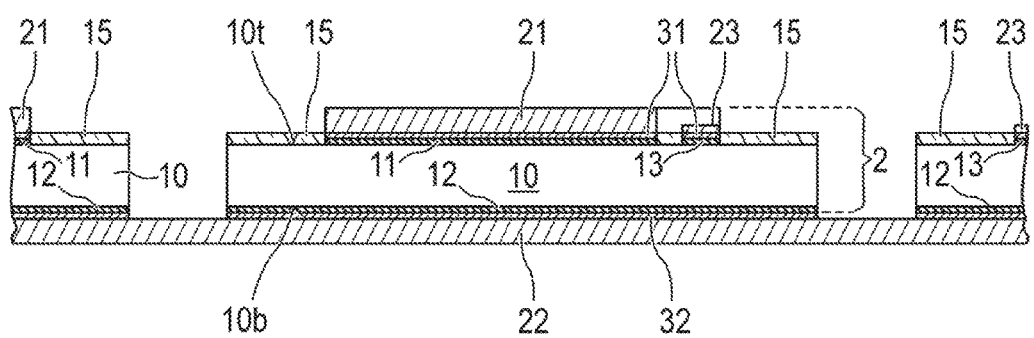

FIG. 1 shows a semiconductor chip 1 and further parts for producing an intermediate product such as is illustrated in FIG. 3. The semiconductor chip 1 comprises a semiconductor body 10 composed of a basic semiconductor material, in which, in particular, p-conducting and n-conducting semiconductor zones can be contained in order to realize a power semiconductor component integrated into the semiconductor body 10. Moreover, the semiconductor chip 1 can also have as many electrically conductive layers as desired such as, for example, metallizations, silicide layers or layers composed of doped polycrystalline semiconductor material (e.g. polycrystalline silicon), but also as many dielectric layers as desired such as, for example, nitride layers (e.g. silicon nitride), or oxide layers (e.g. silicon oxide), or passivation layers such as e.g. imide layers. The basic semiconductor material can be any known basic semiconductor material that is customary for producing semiconductor components, for example arbitrary elemental semiconductors (e.g. silicon, germanium), arbitrary compound semiconductors (e.g. II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

The semiconductor body 10 has a top side 10t, and also an underside 10b opposite the top side. The top side 10t is spaced apart from the underside 10b in a vertical direction v, wherein the vertical direction v runs perpendicularly to the underside 10b. A first (top) main electrode 11 is arranged on the top side 10t, and a second (bottom) main electrode 12 is arranged on the underside 10b. A control electrode 13 is likewise situated on the top side 10t. Furthermore, an optional top dielectric passivation layer 15 can be applied to the top side 10t. This passivation layer 15 can be a polyimide, for example.

The top main electrode 11, the bottom main electrode 12 and the control electrode 13 can be thin metallization layers, for example. Such metallization layers can be applied to the semiconductor body 10 for example as early as during the production of the semiconductor chip 1 in the wafer assemblage with further, identical semiconductor chips 1, that is to say before the wafer has been singulated to form mutually independent semiconductor chips 1.

Figure 2:
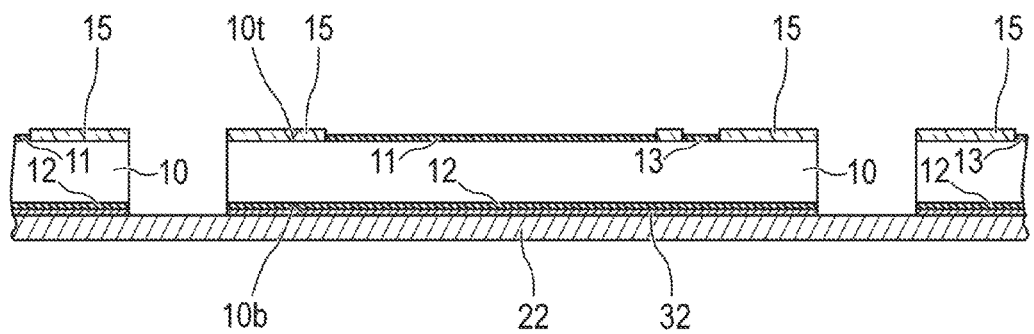

As is illustrated in FIG. 2, a plurality of such semiconductor chips 1 can be mounted jointly and in a manner spaced apart from one another on an electrically conductive bottom compensation lamina 22 by virtue of the fact that they are cohesively and electrically conductively connected to the bottom compensation lamina 22 in each case at their bottom main electrode 12 by means of a bottom connecting layer 32. The bottom compensation lamina 22 is then situated on that side of the bottom main electrode 12 which faces away from the semiconductor body 10.

Before, simultaneously with or—as shown in the present case—after the mounting of the semiconductor chips 1 on the bottom compensation lamina 22, each semiconductor chip 1 is cohesively provided with a dedicated, electrically conductive top compensation lamina 21 by virtue of the top compensation lamina 21 being cohesively connected to the top main electrode 11 by means of a top connecting layer 31 for example by soldering, adhesive bonding or sintering. The top compensation lamina 21 is then situated on that side of the top main electrode 11 of the relevant semiconductor chip 1 which faces away from the semiconductor body 10 of said semiconductor chip.

An electrically conductive contact piece 23 can optionally also be fitted on the control electrode 13 of each of the semiconductor chips 1, which contact piece is cohesively and electrically conductively connected to the control electrode 13 by means of the top connecting layer 31. If such a contact piece 23 is provided, the adjacent top compensation lamina 21 can have a cutout 213 (FIG. 1), in which the contact piece 23 is positioned.

The respectively optional compensation laminae 21 and 22 serve, in particular, to reduce mechanical stresses which occur if such a compensation lamina 21, 22 is subjected to pressure contact-connecting by a contact plate 41 and respectively 42 (e.g. composed of copper), which will be explained later, said contact plate having a coefficient of thermal expansion which is greatly different from the coefficient of thermal expansion of the semiconductor body 10. In the absence of compensation laminae 21, 22, the contact plates 41 and 42 make contact directly with the very thin main electrodes 11 and 12, respectively.

The compensation laminae 21 and 22 have (before mounting on the top main electrode 11 and the bottom main electrode 12, respectively, and directly after mounting) relatively large thicknesses d21' and d22', respectively, in the vertical direction v—independently of one another and in arbitrary combinations with one another—for example at least 0.5 mm, at least 1 mm, or at least 1.5 mm. The large thicknesses are intended to prevent damage to the main electrodes 11 and 12 if the compensation laminae 21 and/or 22 are ground, as will be explained later.

Optionally, the top compensation laminae 21 and/or the bottom compensation lamina 22 can in each case have a coefficient of linear thermal expansion that is significantly lower than the coefficient of linear thermal expansion of the contact plates 41, 42, yet to be described, in order to achieve an adaptation of a high coefficient of linear thermal expansion of the contact plates 41, 42 to the low coefficient of linear thermal expansion of the semiconductor body 10. By way of example, the top compensation laminae 21 and/or the bottom compensation lamina 22, at a temperature of 20° C., can have a coefficient of linear thermal expansion of less than 11 ppm/K or even of less than 7 ppm/K. In this case, the top compensation lamina 21 and/or the bottom compensation lamina 22 can for example consist of one of the following materials, comprise one of the following materials or have one of the following constructions: molybdenum; a metal matrix composite material (MMC), for example AlSiC (aluminum silicon carbide); a multilayer material comprising two or more metal layers, for example a three-layer material having the layer sequence copper-molybdenum-copper (Cu—Mo—Cu), e.g. having layer thicknesses in the ratio of 1:4:1, which produces a coefficient of expansion of the Cu—Mo—Cu three-layer material of approximately 7.3 ppm/K.

The top connecting layers 31 can be embodied for example as arbitrary solder layers, in particular also as diffusion solder layers, as sintered layers containing a sintered metal powder (e.g. silver powder or silver flakes), or as an electrically conductive adhesive layer. Independently thereof, the bottom connecting layer 32 can also be embodied as an arbitrary solder layer, in particular also as a diffusion solder layer, as a sintered layer containing a sintered metal powder (e.g. silver powder or silver flakes), or as an electrically conductive adhesive layer. The top connecting layer 31 and the bottom connecting layer 32 can consist of the same material, in particular; however, it is also possible to use arbitrary combinations of the materials mentioned for the two layers.

In FIG. 1, the starting materials used for producing the top connecting layer 31 and the bottom connecting layer 32 are designated by 31' and 32', respectively. This is intended to express the fact that the original connecting means 31' and 32' can be present in an altered form after the connection has been produced.

In the case of a starting material 31', 32' embodied as solder (for example a tin-containing solder), the resulting connecting layer 31 and 32, respectively, can contain a material (e.g. copper) which diffused into the solder from the top main electrode 11 and the bottom main electrode 12, respectively, during the connection process and thus constitutes a constituent of the finished connecting layer 31 and 32, respectively. In order to produce the connections, the solder 31', 32' can be applied in the form of a solder paste, for example, to the main electrodes 11, 12 and/or to the compensation laminae 21, 22 (for example by screen or stencil printing). Likewise, however, the solder 31', 32' can also be introduced in the form of a prefabricated solder lamina ("preform solder") respectively between the top compensation lamina 21 and the top main electrode 11 of the relevant semiconductor chip 1 and between the bottom compensation lamina 22 and the bottom main electrodes 12. In any case the solder paste or the solder lamina/laminae for producing the connections explained are melted and subsequently cooled, such that a cohesive connection in each case arises between the top compensation lamina 21 and the top main electrode 11 and respectively between the bottom compensation lamina 22 and the bottom main electrode 12.

In the case of a connecting layer 31 and 32 embodied as a sintered layer, the starting material 31' and 32', respectively, on which said layer is based can be embodied as a paste containing a metal powder (e.g. silver powder or silver flakes) and a solvent. In order to produce the connections, the paste can be applied, for example, to the main electrodes 11, 12 and/or to the compensation laminae 21, 22 (for example by screen or stencil printing). A paste layer formed from the paste is then arranged in each case between the top main electrode 11 and the top compensation lamina 21 and makes contact with each of them. Correspondingly, a further paste layer formed from the paste is arranged between the bottom main electrodes 12 and the bottom compensation lamina 22 and makes contact with each of them. In this state, the paste layers are dried by evaporation of the solvent contained therein and are then sintered, wherein the sintering can be carried out at temperatures of significantly less than 250° C. As a result of the sintering, the (electrically conductive) top connecting layers 31 and respectively the (electrically conductive) bottom connecting layers 32 are formed from the paste layers.

In the case of a connecting layer 31 and 32 embodied as an electrically conductive adhesive layer, the starting material 31' and 32', respectively, on which said layer is based is embodied as an electrically conductive adhesive. In order to produce the connections, the adhesive can be applied, for example, to the main electrodes 11, 12 and/or to the compensation laminae 21, 22 (for example by screen or stencil printing). A top adhesive layer formed from the adhesive is in each case arranged between the top main electrode 11 and the top compensation lamina 21 and makes contact with each of them. As a result of the subsequent curing, the electrically conductive top connecting layers 31 form from the top adhesive layers. Correspondingly, bottom adhesive layers formed from an adhesive are arranged between the bottom main electrodes 12 and the bottom compensation lamina 22 and make contact with each of them. As a result of the subsequent curing, the electrically conductive bottom connecting layers 32 form from the bottom adhesive layers.

If an optional contact piece 23 is provided, it can be cohesively connected to the control electrode 13 by means of any of the connecting techniques such as have already been explained for the connection between the top compensation laminae 21 and the top main electrodes 11, to be precise independently of the connecting techniques chosen for the connections between the top compensation laminae 21 and the top main electrode 11.

Each semiconductor chip 1 and the associated top compensation lamina 21 form constituents of a chip assembly 2, which is illustrated in FIG. 3. As is shown in FIG. 3, a plurality of such chip assemblies 2 can be cohesively and electrically conductively connected to the bottom compensation lamina 22, as explained, at the bottom main electrodes 12 of the semiconductor chips 1 of the chip assemblies 2.

Figure 4:
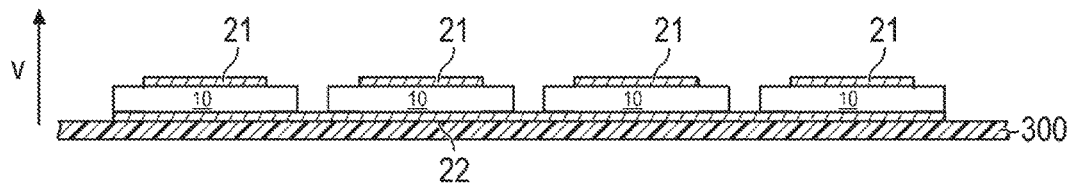

After or before the mounting of the top compensation laminae 21 on the semiconductor chips 1 or even before the mounting of the semiconductor chips 1 on the bottom compensation lamina 22, the bottom compensation lamina 22, for the purpose of further processing temporarily, if appropriate with the semiconductor chips 1 already cohesively connected thereto and/or with the top compensation laminae 21 cohesively connected to the semiconductor chips 1, can be fixed on an auxiliary carrier 300, which is shown as the result in FIG. 4. For this purpose, the auxiliary carrier 300 can have an adhesive surface, for example. A double-sided adhesive film can also be used, by means of which the bottom compensation lamina 22 is adhesively bonded to the auxiliary carrier 300. As a result, the top compensation laminae 21 are situated in each case on that side of the relevant semiconductor chip 1 which faces away from the auxiliary carrier 300, while the bottom compensation lamina 22 is arranged between the semiconductor chips 1, on the one hand, and the auxiliary carrier 300, on the other hand.

Figure 5:
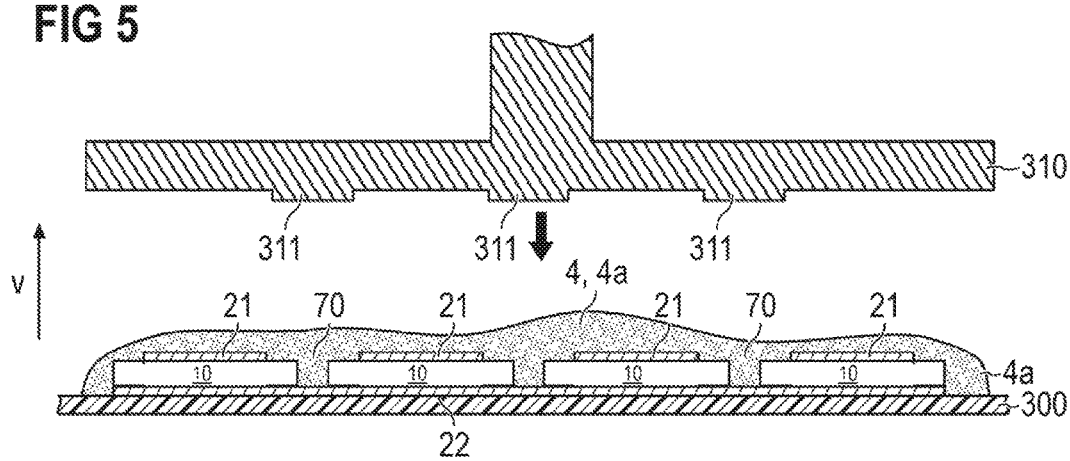
Figure 6:
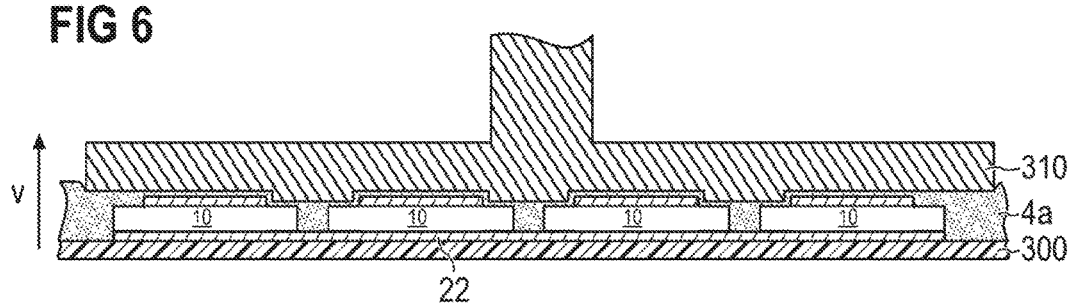

As is furthermore illustrated in FIG. 5, the semiconductor chips 1 situated on the auxiliary carrier 300 and provided with the top compensation laminae 21 are then embedded into a viscous embedding compound 4a. By way of example, the embedding compound 4a, as illustrated in FIG. 6, can be pressed in the direction of the semiconductor chips 1 and the auxiliary carrier 300 by means of a stamp 310, such that at least the interspaces situated between respectively adjacent semiconductor chips 1 are filled with the embedding compound 4a. For this purpose, a stamp 310 can press against the embedding compound 4a from those sides of the semiconductor chips 1 and of the embedding compound 4a which face away from the auxiliary carrier 300 after the embedding compound 4a has previously been applied to the semiconductor chips 1 situated on the auxiliary carrier 300 and provided with the top compensation laminae 21. As a result, the embedding compound 4a is distributed uniformly over the semiconductor chips 1 and the interspaces situated between the semiconductor chips 1 are filled with the embedding compound 4a, the result of which is shown in FIG. 7 after the stamp 7 has been lifted off.

Before, during or after the lift-off of the stamp 7, the embedding compound 4a is cured, such that the semiconductor chips 1 embedded into the embedding compound 4a together with the embedding compound 4a form a solid assemblage. The semiconductor chips 1 are therefore cohesively connected to one another by means of the embedding compound 4a.

The embedding compound 4a is dielectric at least in the cured state. Examples of a suitable embedding compound 4a include polycondensed polymers (e.g. an epoxy resin or a polyurethane-based potting material). In particular, the embedding compound 4a can be a molding compound applied by encapsulation or injection molding. In principle, however, for all configurations of the invention, any embedding compounds 4a can be used, provided that they are dielectric in the cured state. In particular, an embedding compound 4a according to the present invention can be formed from a homogeneous material or a homogeneous material mixture.

Figure 7:
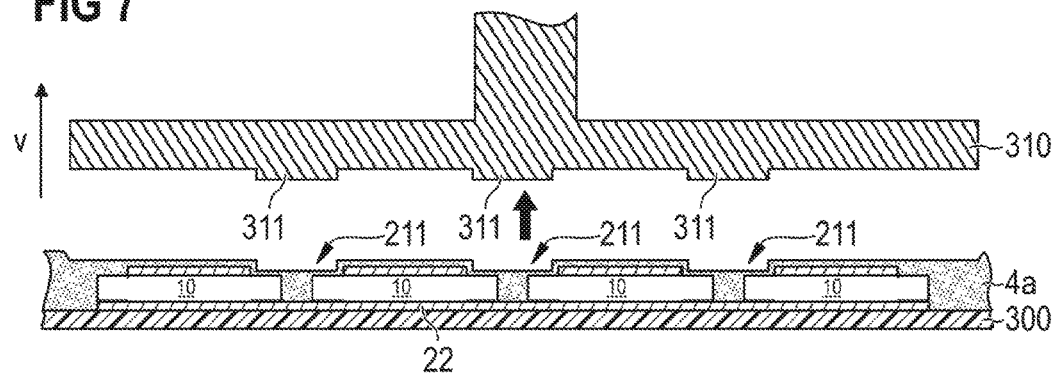

In accordance with an optional configuration, likewise shown in FIGS. 5 to 7, the stamp 310 can comprise one or a plurality of projections 311 which, when the stamp 310 presses against the as yet non-cured embedding compound 4a, project into a free space 211 between adjacent chip assemblies 2, such that said free space 211 is not filled with embedding compound 4a.

In principle, such a free space 211 between adjacent chip assemblies 2 can also be produced in any other manner desired, for example by milling, chemically (by masked etching), by laser ablation or by any other suitable method.

Independently of how such a free space 211 arises, the latter can be used to accommodate a control electrode interconnection structure 70. Generally, a control electrode interconnection structure 70 is an electrically conductive structure that serves to electrically conductively connect the control electrodes 13 of the semiconductor chips 1 to one another, and to a terminal location via which the same, i.e. a common, electrical drive signal can be fed to all the control electrodes 13.

Figure 8:
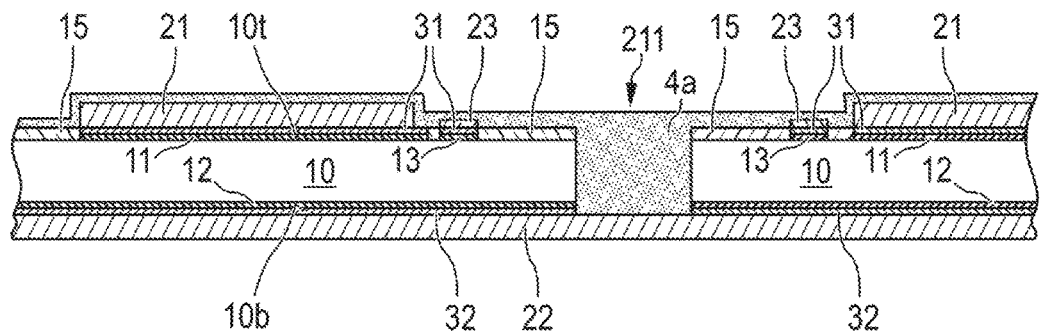
Figure 9:
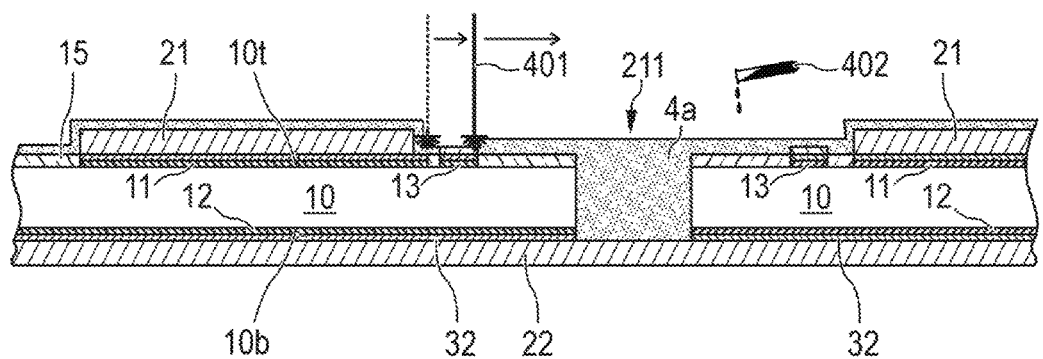

As can be discerned from the enlarged portion of the arrangement (optionally detached from the auxiliary carrier 300) in accordance with FIG. 7, said enlarged portion being illustrated in FIG. 8, the control electrodes 13 may still be covered by a layer of the embedding compound 4a. In such cases, the embedding compound 4a is opened locally above the control electrodes 13 to form openings in the embedding compound 4a in order to enable the electrical contacting of said control electrodes. By way of example, a laser beam 401 and/or an etchant 402 can be used for this purpose, which is illustrated in FIG. 9 and as the result in FIG. 10.

Figure 10:
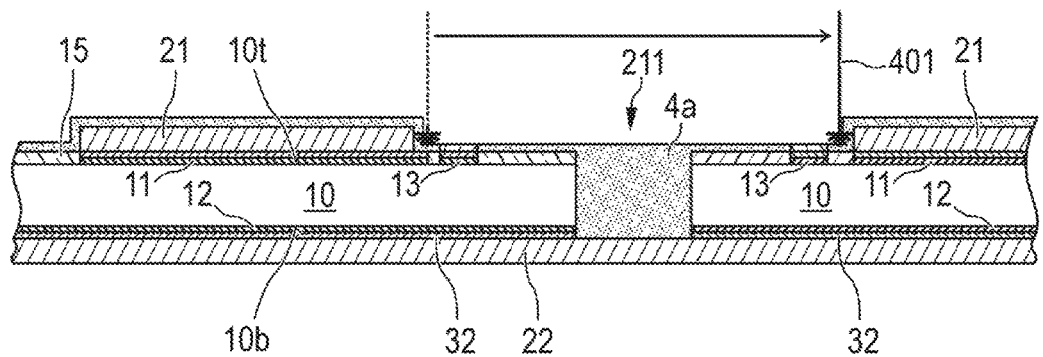

In the case of an etchant, the etch can be carried out in a masked manner using a structured etching mask which is produced on the embedding compound 4a and which has openings above the control electrodes 13. If the control electrodes 13 are covered only by a very thin layer of the embedding compound 4a an etch can also be carried out without masking, since the control electrodes 13 are then exposed during etching, while the embedding compound 4a is not opened in other (thicker) regions. Suitable etching methods in principle are any desired etching methods, e.g. isotropic etching methods (e.g. etching using a liquid etchant) or anisotropic etching methods (e.g. reactive ion etching; RIE). The horizontal arrows in FIGS. 9 and 10 schematically illustrate the movement of the laser beam 401.

In any case, as a result on account of the opened embedding compound 4a, the control electrodes 13 can be electrically contacted and electrically connected to one another, which is possible in principle with the aid of any desired techniques. In the example shown, the control electrodes are equipped with optional contact pieces 23. Said contact pieces 23 are exposed after the embedding compound 4a has been opened, and can be contacted directly. If no contact pieces 23 are used, then the control contacts 13 themselves are exposed after the embedding compound 4a has been opened, and can be contacted directly.

Figure 11:
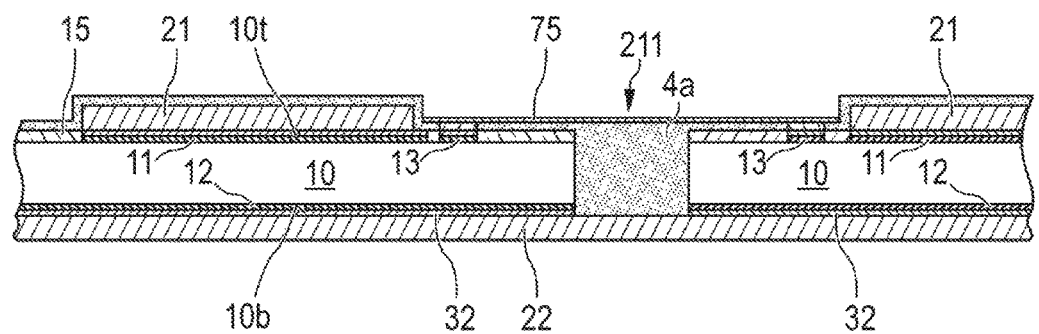

In accordance with an example illustrated with reference to FIGS. 11 to 13, a control electrode interconnection structure 70 (FIGS. 12 and 13) can be electrically conductively adhesively bonded either to the control electrodes 13 (if no contact pieces 23 are used) or to the contact pieces 23 directly by means of an electrically conductive adhesive 75 through the opened embedding compound 4. In this sense "directly" means that the adhesive 75 goes firstly against the control electrodes 13 (if no contact pieces 23 are used) or against the contact pieces 23 and secondly against the control electrode interconnection structure 70.

Figure 12:
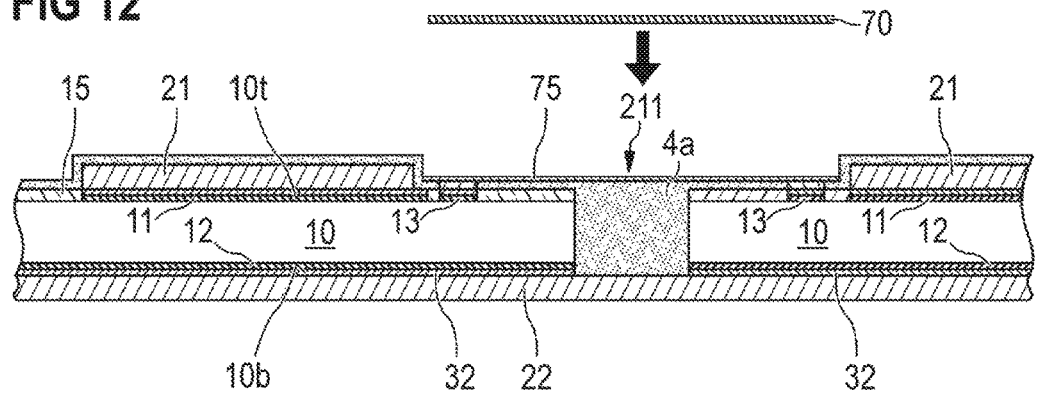
Figure 13:
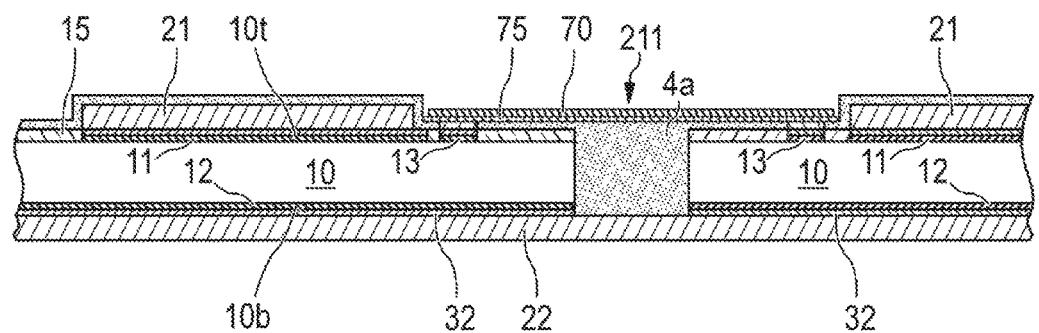

As is illustrated (merely by way of example) in FIGS. 12 and 13, the control electrode interconnection structure 70 can comprise a structured or unstructured metal sheet, or be embodied as a structured or unstructured metal sheet. Optionally, such metal sheets can be embodied as planar sheets. Within the meaning of the present invention, thin metal films are also regarded as "metal sheets".

In principle, however, any other control electrode interconnection structures 70 can also be used. Generally a control electrode interconnection structure 70 can be constructed arbitrarily as long as it can be used to achieve an electrically conductive connection of the control electrodes 13. Optionally, a control electrode interconnection structure 70 can be accommodated completely in the free space 211 between adjacent chip assemblies 2, which is likewise shown in FIG. 13.

Figure 14:
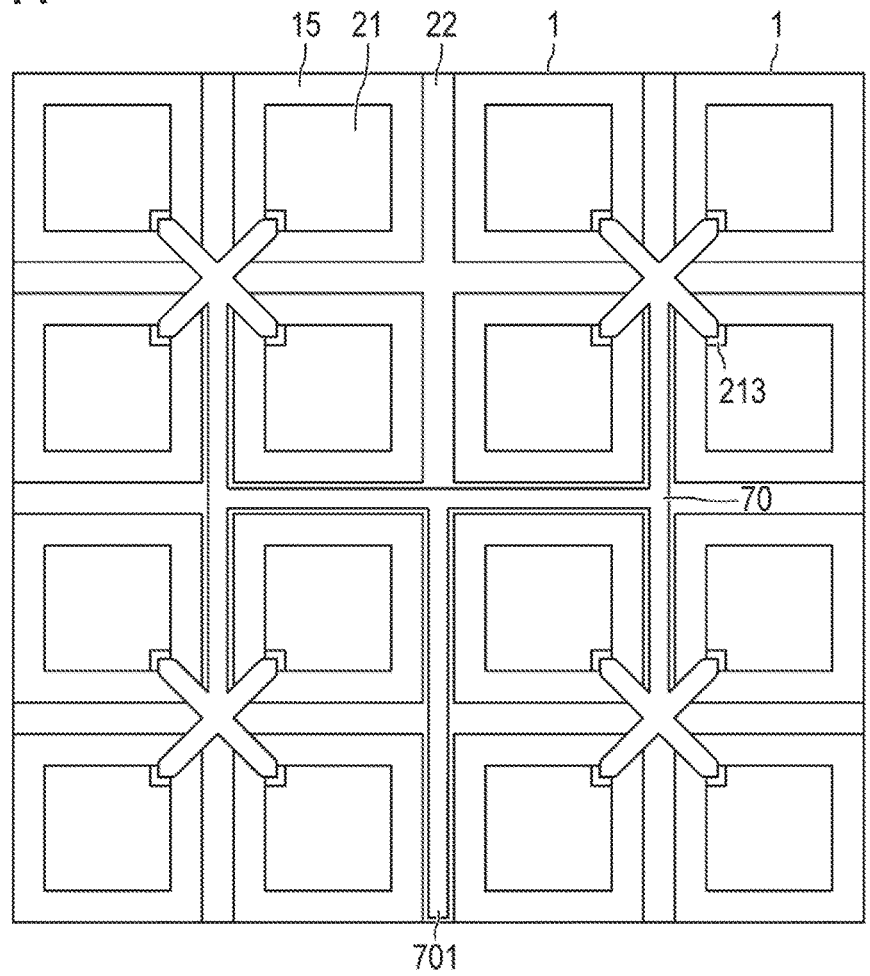

FIG. 14 shows a plan view of the entire arrangement in accordance with FIG. 13 comprising the top compensation laminae 21 exposed in the embedding compound 4a, and comprising the control electrode interconnection structure 70. A terminal location 701 of the control electrode interconnection structure 70 serves later as a terminal location for jointly electrically contacting the control electrodes 13.

In the case of the arrangement in accordance with FIG. 14 by way of example, 16 semiconductor chips 1 are arranged in the form of a 4×4 matrix alongside one another on the bottom compensation lamina 22. As is likewise shown, optionally in each case four of the semiconductor chips 1 can be arranged in a 2×2 matrix alongside one another in such a way that the control electrodes 13 (hidden by the control electrode interconnection structure 70 in FIG. 14; they are situated in each case in the region of a cutout 213 of a top compensation lamina 21) are situated in each case at the mutually facing corners of the four semiconductor chips 1. In principle, as in all the other examples of the invention, the number and the arrangement of the semiconductor chips 1 are arbitrary, i.e. fewer or more than 16 semiconductor chips 1 can be interconnected. By way of example, the number of semiconductor chips 1 may be given by a power of two $2^n$ where n>2. Independently thereof, the number of semiconductor chips 1 may be for example at least 4, at least 8 or even at least 16.

Figure 15:
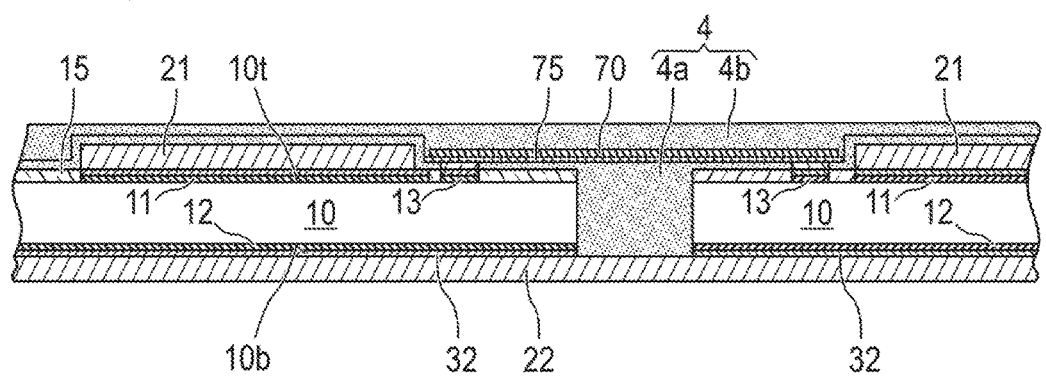

An arrangement provided with a control electrode interconnection structure 70, such as is shown by way of example in FIGS. 13 and 14, can optionally also be provided with a further embedding compound 4b, which also partly or completely embeds the control electrode interconnection structure 70, which is shown as the result in FIG. 15. All of the already explained materials that can be used for the embedding compound 4a can be used as materials for the further embedding compound 4b, specifically in any desired material combinations. In particular, the same material can also be used for the embedding compounds 4a and 4b.

In the context of the present application, the reference sign "4" denotes an embedding compound. The latter can consist only of a first part 4a; however, it can also comprise a first part 4a and a second part 4b or consist of a first part 4a and a second part 4b.

Figure 16:
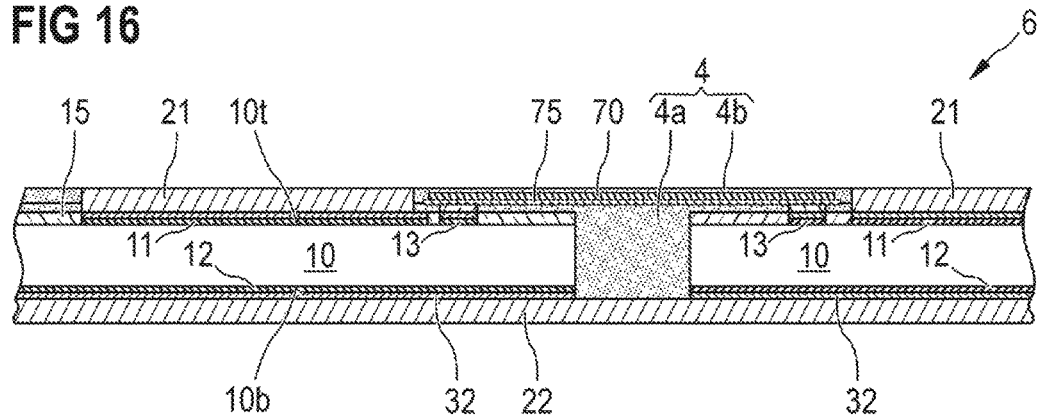

Since the top compensation laminae 21 may be covered with embedding compound 4a and/or 4b, the arrangement can be ground until the top compensation laminae 21 are exposed in each case at their side facing away from the associated semiconductor chip 1 and can thus be electrically contacted, which is shown as the result in FIG. 16. What can be achieved thereby, for example, is that those sides of the top compensation laminae 21 which face away from the associated semiconductor chips 1 are arranged in one plane. The semiconductor chips 1 cohesively connected to one another by means of the embedding compound 4 even after the grinding, the top compensation laminae 21 exposed at their sides facing away from the semiconductor chips 1, the embedding compound 4 and also the control electrode interconnection structure 70 are constituents of an assemblage 6.

The grinding can be carried out for example by machining (grinding, polishing, lapping, etc.) in a conventional wafer grinding installation. In all configurations in which the top compensation laminae 21 are ground, the thicknesses thereof are slightly reduced compared with their original thicknesses d21' (see FIG. 1), for example by approximately 0.1 mm. However, the reduced thickness can still be, for example, at least 0.4 mm, at least 0.9 mm, or at least 1.4 mm.

Figure 17:
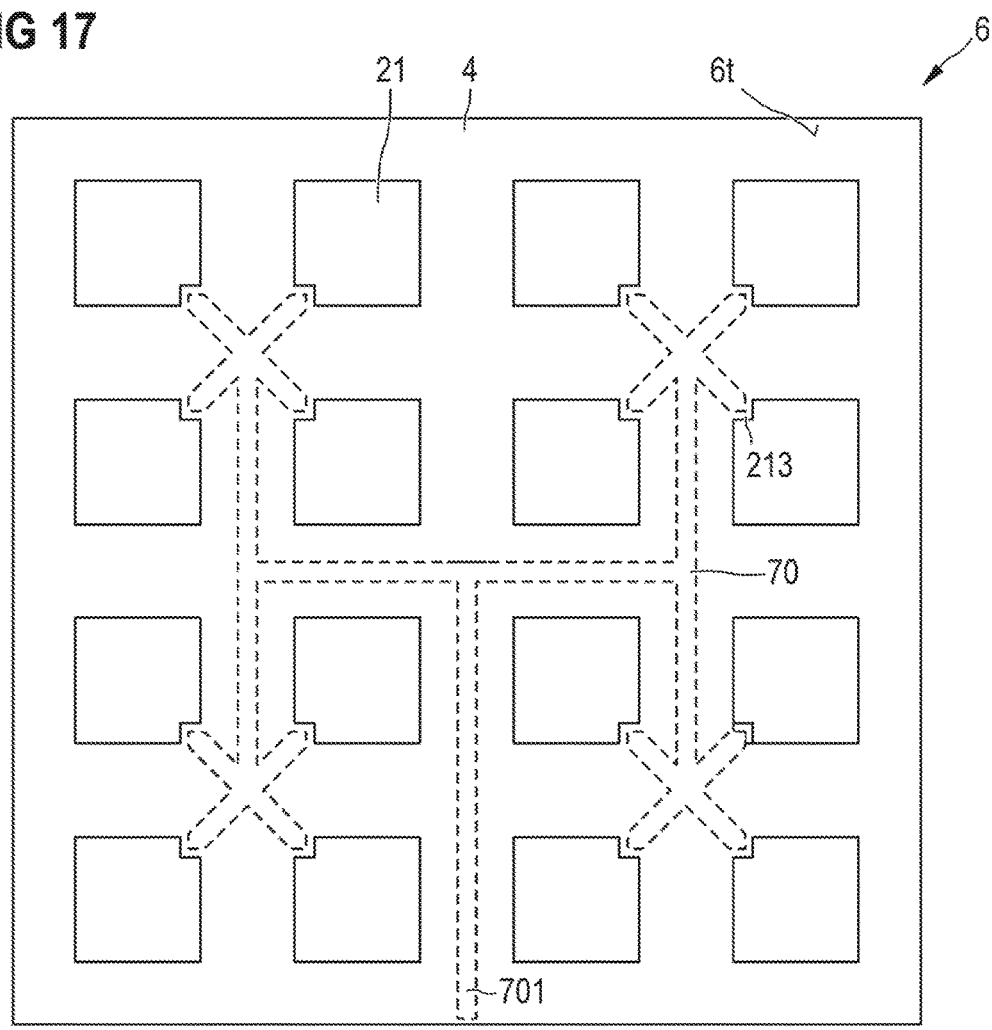

FIG. 17 shows a plan view of the entire arrangement in accordance with FIG. 16 comprising the top compensation laminae 21 exposed in the entire embedding compound 4 (the latter comprises the embedding compounds 4a and 4b) and comprising the control electrode interconnection structure 70 hidden by the entire embedding compound 4 and therefore illustrated in a dashed fashion.

As is additionally shown, the terminal location 701 can be embedded into the entire embedding compound 4. In this case, the embedding compound 4 can be opened locally in order to enable the terminal location 701 to be electrically contacted. By way of example, this can be carried out once again by means of a laser beam, a masked etch, by screwing in a terminal screw that makes contact with a terminal location 701, or by any other types of contacting. As an alternative thereto, the terminal location 701 can also project from the embedding compound 4.

Figure 18:
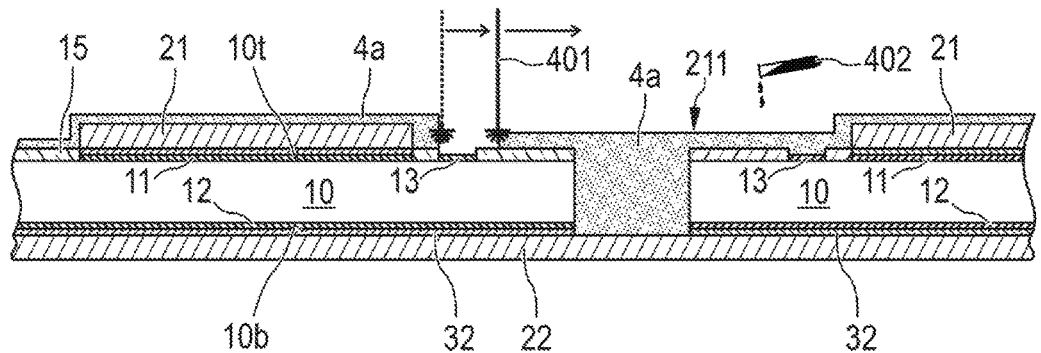
FIGS. 18 to 20 show different steps of a second example for producing a chip assemblage.
Figure 19:
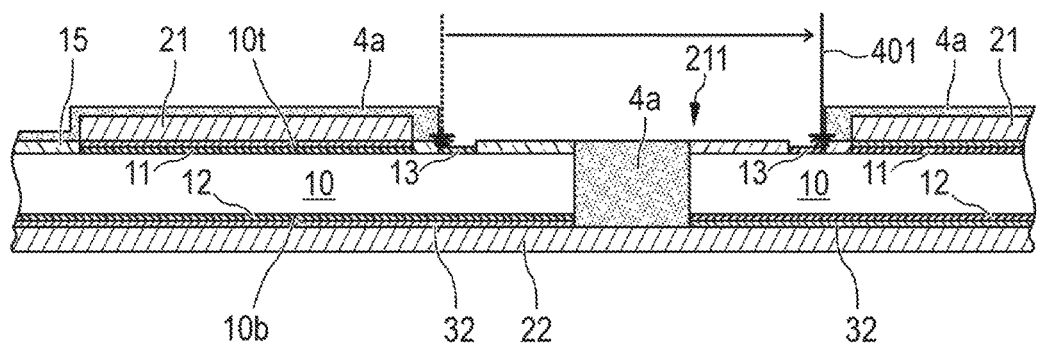
Figure 20:
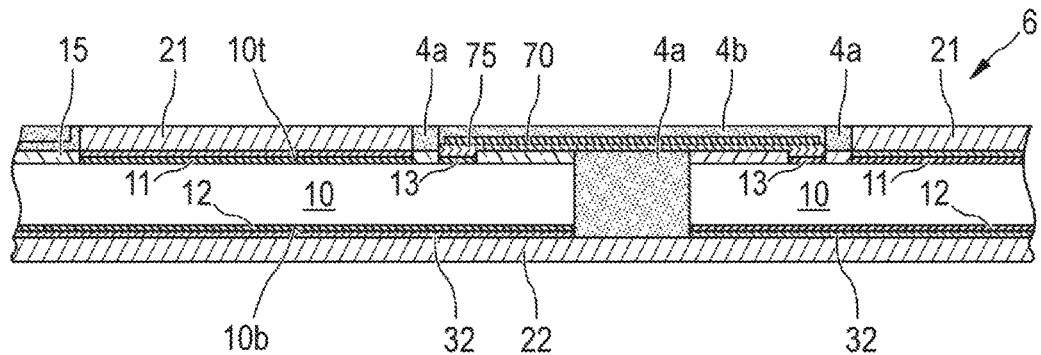

FIGS. 18 to 20 show a modification of the method explained above. The sole difference is that no contact pieces 23 are used on the control electrodes 13, such that the control electrodes 13 themselves are exposed after the embedding compound 4a has been locally opened, and can therefore be directly electrically contacted. Otherwise, the steps shown in FIGS. 18 to 20 correspond to FIGS. 9, 10 and 16, respectively. The semiconductor chips 1 cohesively connected to one another by means of the embedding compound 4, the top compensation laminae 21 exposed at their sides facing away from the semiconductor chips 1, the embedding compound 4 and also the control electrode interconnection structure 70 are once again constituents of an assemblage 6.

Figure 21:
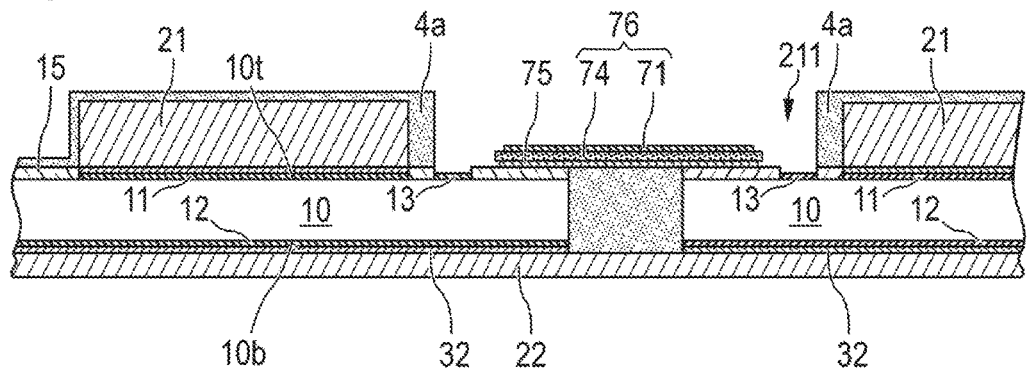
FIGS. 21 to 23 show different steps of a third example for producing a chip assemblage.

As is furthermore illustrated in FIG. 21, a control electrode interconnection structure 70 can comprise one or a plurality of prefabricated elements, for example one or a plurality of prefabricated printed circuit boards 76, each of which has a dielectric isolation carrier 74 and a printed circuit board metallization 71.

As the dielectric isolation carrier 74, it is possible to use, for example, ceramics such as aluminum oxide, aluminum nitride or other ceramics, but also non-ceramic materials such as glasses or FR4, for example. In the case of a dielectric isolation carrier 74 composed of aluminum oxide, the printed circuit board 76 can be embodied as a DCB substrate (DCB="direct copper bonding"), in which the printed circuit board metallization 71 consists of copper and is directly connected to the aluminum oxide isolation carrier 74. The dielectric isolation carrier 74 (ceramic, glass, plastic) of a printed circuit board 76 can be metallized on two sides or—as illustrated—only on one side. Further examples of a prefabricated element are: a semiconductor substrate metallized conductively on one or both sides; a functional semiconductor chip metallized conductively on one or both sides; a glass substrate metallized conductively on one or both sides; a ceramic substrate metallized conductively on one or both sides.

The control electrode interconnection structure 70 comprising the prefabricated printed circuit board(s) 76 can once again be arranged completely in the free space 211. The printed circuit board metallization 71 here can be situated in each case on the side of the isolation carrier 74 facing away from the semiconductor chips 1, such that the printed circuit board metallization 71 is freely accessible from above. The printed circuit board 76 can optionally be fixed to the embedding compound 4a and/or the semiconductor chips 1 by means of an electrically conductive or an electrically insulating adhesive 75.

Figure 22:
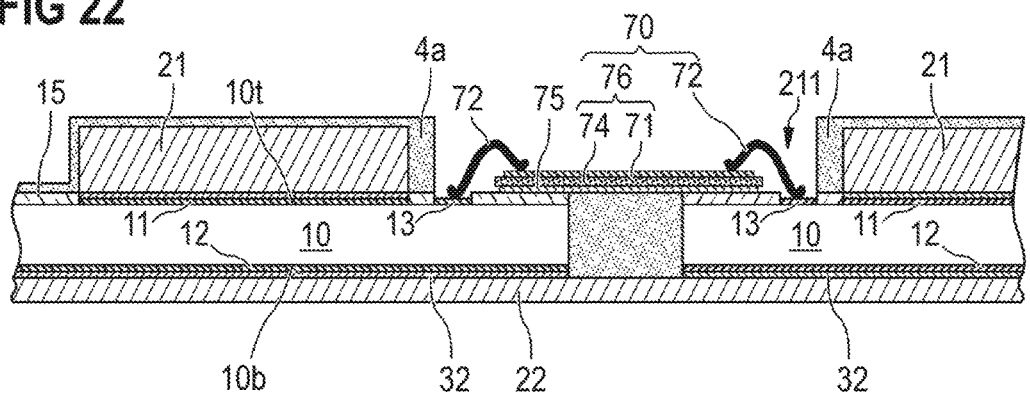

As is furthermore shown in FIG. 22, it is possible to use bonding wires 72 which are bonded, in each case at a first bonding location, directly to the exposed control electrodes 13 or, if contact pieces 32 are used (not illustrated, directly to the exposed contact pieces 23, and, at a second bonding location, directly to the or one of the printed circuit board metallizations 71. Generally, the bonding wires 72 also form constituents of the control electrode interconnection structure 70.

Figure 23:
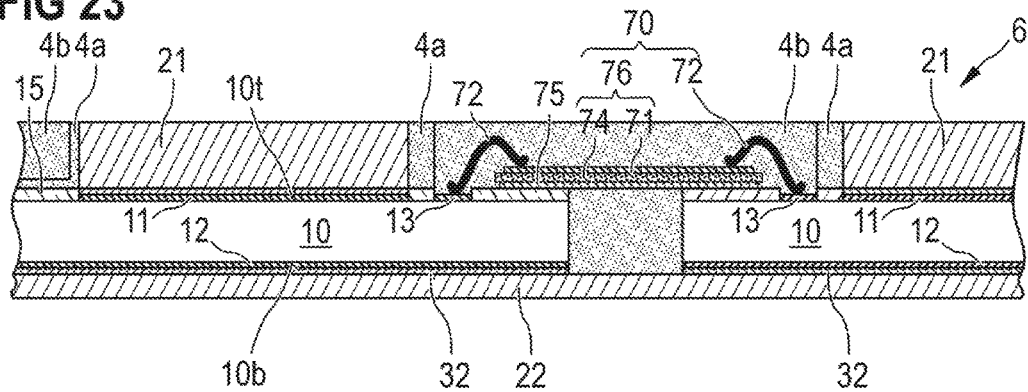
Figure 27:
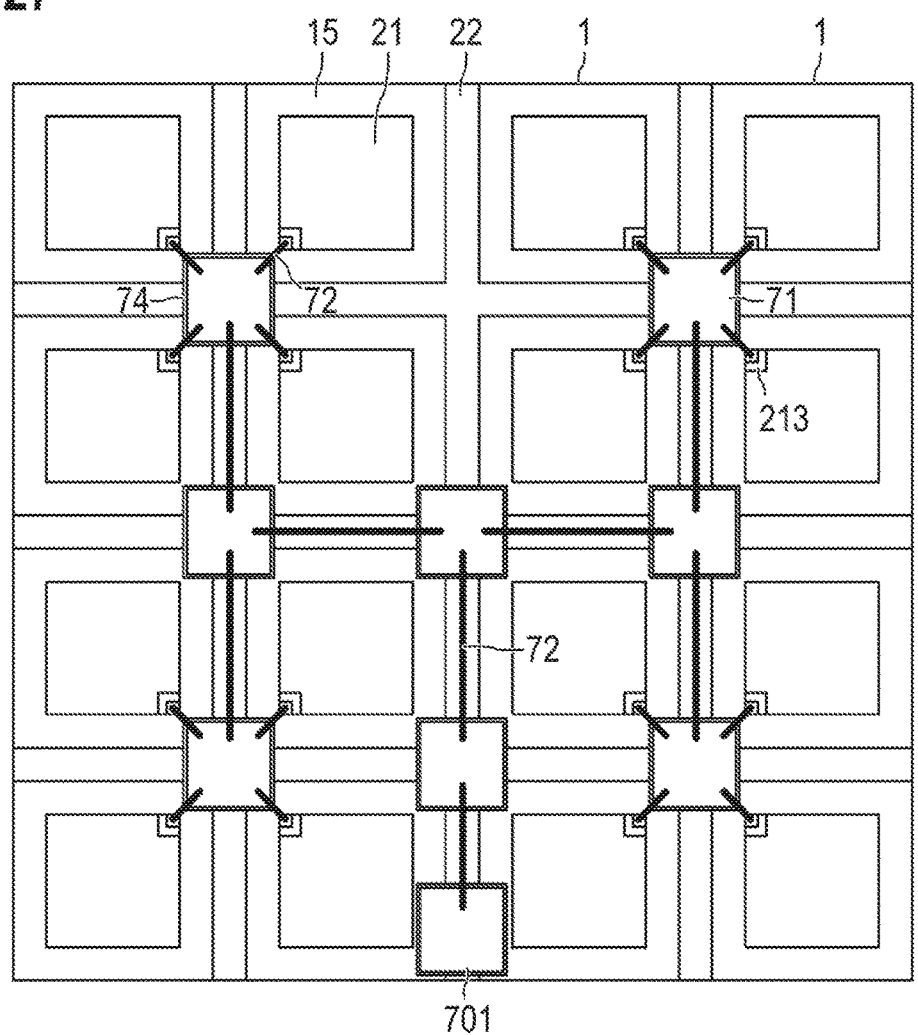

As is furthermore illustrated in FIG. 23, as a result such a control electrode interconnection structure 70 can also be embedded into a further embedding compound 4b and the arrangement can then be ground, such that the top compensation laminae 21 are exposed at their sides facing away from the associated semiconductor chips 1 and can be electrically contacted. The semiconductor chips 1 cohesively connected to one another by means of the embedding compound 4, the top compensation laminae 21 exposed at their sides facing away from the semiconductor chips 1, the embedding compound 4 and also the control electrode interconnection structure 70 are once again constituents of an assemblage 6.

A modification of the example explained with reference to FIGS. 21 to 23 is illustrated in FIGS. 24 and 25. In a departure from the example in FIGS. 21 to 23, the control electrode interconnection structure 70 is mounted in the free space 211 before the semiconductor chips 1 are cohesively connected to one another by means of an embedding compound 4a and/or 4b. The control electrode interconnection structure 70 is accordingly adhesively bonded onto the semiconductor chips 1 by means of the adhesive 75 (FIG. 24). Only afterward is this arrangement provided with an embedding compound 4a (the latter can form the entire embedding compound 4), which cohesively connects the semiconductor chips 1 after curing and which additionally encloses the control electrode interconnection structure 70, such that the control electrode interconnection structure 70 is embedded into the embedding compound 4a or 4. After embedding, the arrangement can be ground again, such that the top compensation laminae 21 are exposed at their sides facing away from the associated semiconductor chips 1 and can be electrically contacted. Here, too, the semiconductor chips 1 cohesively connected to one another by means of the embedding compound 4, the top compensation laminae 21 exposed at their sides facing away from the semiconductor chips 1, the embedding compound 4 and also the control electrode interconnection structure 70 are constituents of an assemblage 6.

As can be discerned with reference to the plan view in accordance with FIG. 26, which corresponds to FIG. 24, a control electrode interconnection structure 70 can comprise two or more printed circuit boards each having a dielectric isolation carrier 74 and a printed circuit board metallization 71. Bonding wires 72 can then subsequently be bonded in each case to one of the control terminals 13 and to one of the printed circuit board metallizations 71.

Optionally, further bonding wires 72 can be used to electrically connect printed circuit board metallizations 71 of different printed circuit boards to one another. Moreover, the printed circuit board metallization 71 of one of the printed circuit boards can be used as a terminal location 701.

Figure 28:
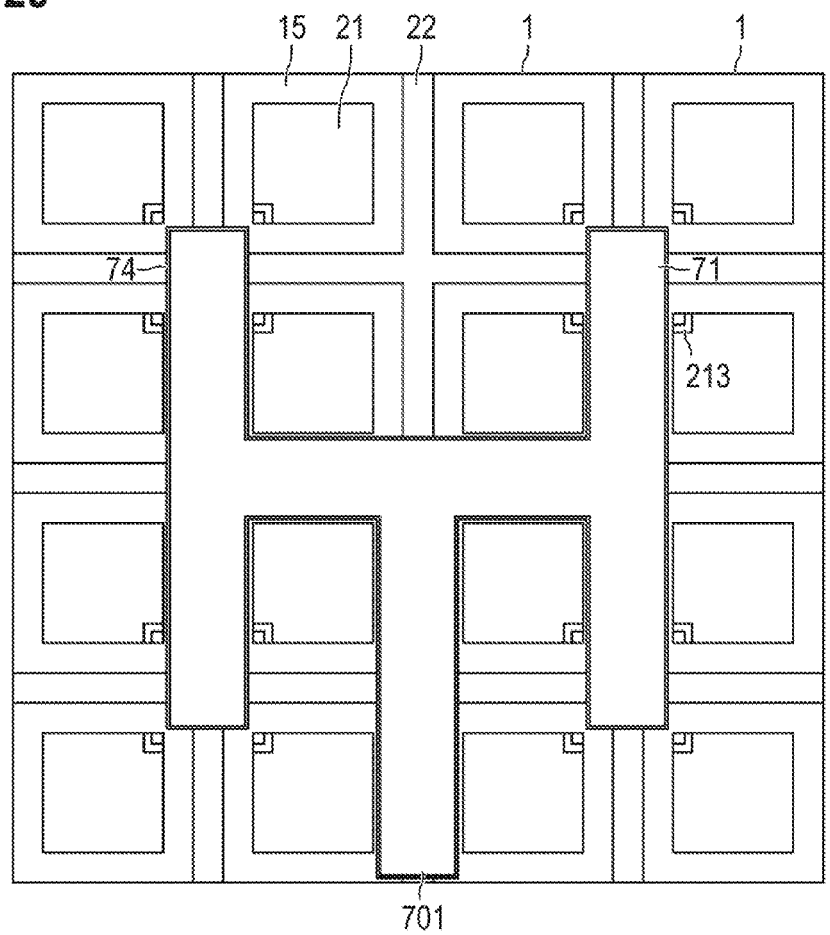
FIGS. 28 to 29 show different steps of a fifth example for producing a chip assemblage.
Figure 29:
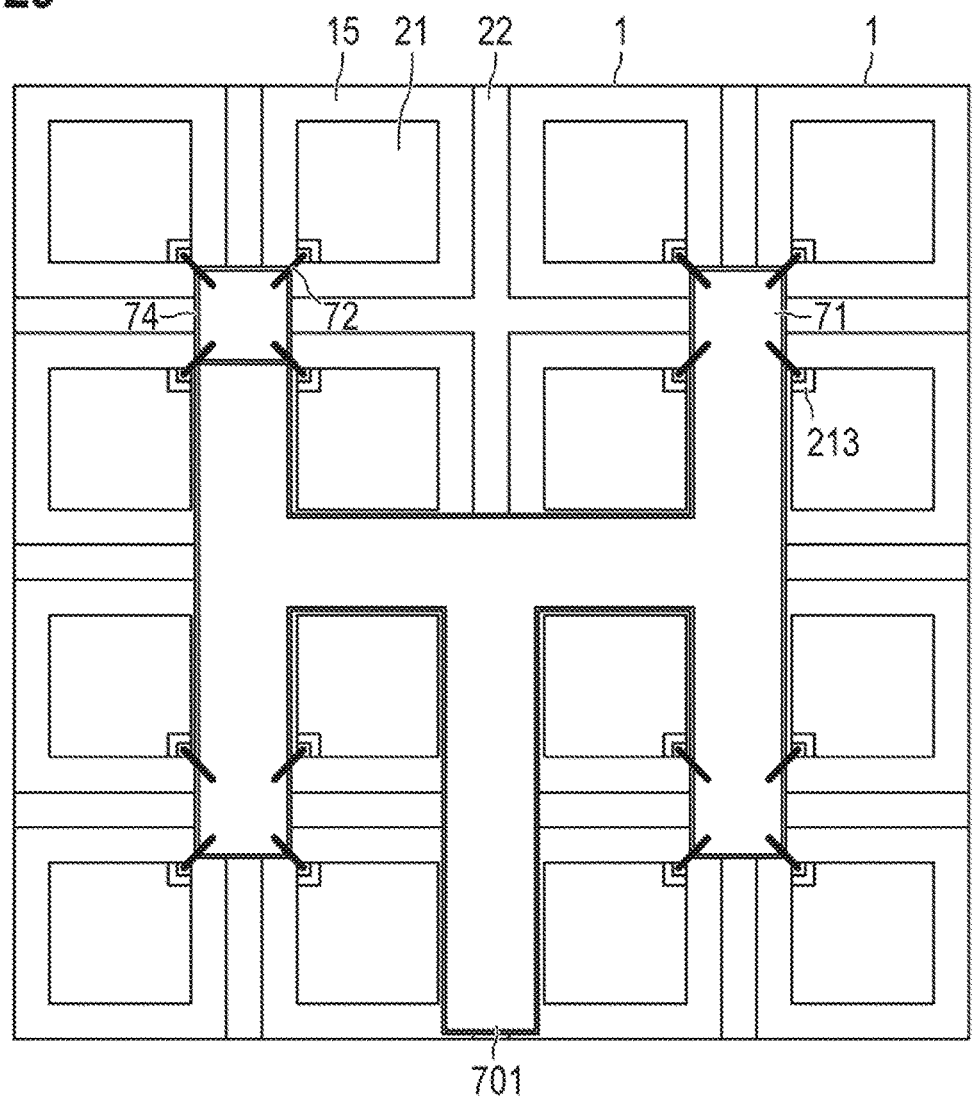

A modification thereof is illustrated in FIGS. 28 and 29. Here, the control electrode interconnection structure 70 comprises only a single printed circuit board having a dielectric isolation carrier 74 and a printed circuit board metallization 71. FIG. 28 shows the arrangement after the adhesive bonding of the printed circuit board 76. Afterward, bonding wires 72 are bonded in each case to one of the control terminals 13 and to the printed circuit board metallizations 71, which is shown as the result in FIG. 29.

As in the other variants, the arrangement in the examples in accordance with FIGS. 24 to 27 and/or the examples in accordance with FIGS. 28 and 29, after the electrical connection of the control electrodes 13 by means of the control electrode interconnection structure 70, can also be provided with an embedding compound 4 that cohesively connects the semiconductor chips 1 to one another.

Alternatively, it is also possible, already before the electrical connection of the control electrodes 13 by means of the control electrode interconnection structure 70, to provide the semiconductor chips 1 with an embedding compound 4a that cohesively connects the semiconductor chips 1 to one another, and then with a further embedding compound 4b that also encloses and embeds the control electrode interconnection structure 70.

Figure 30:
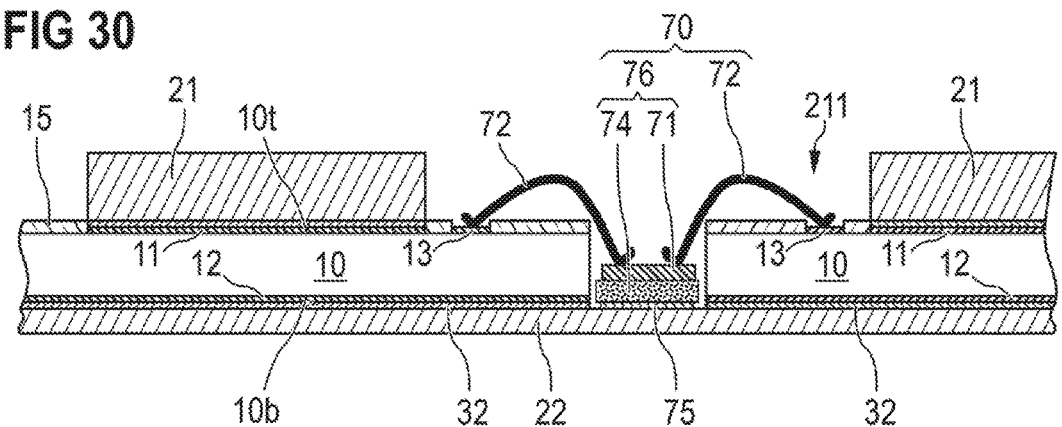
FIGS. 30 to 31 show different steps of a sixth example for producing a chip assemblage.
Figure 31:
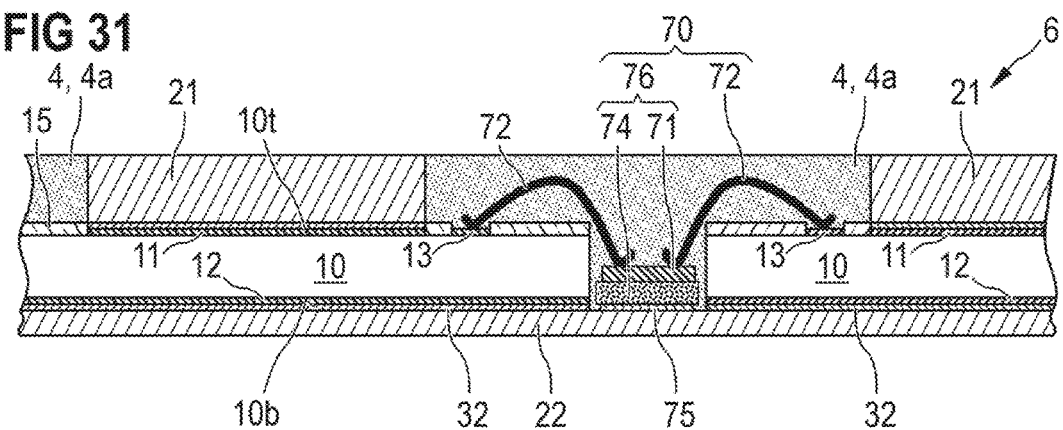

The same correspondingly also applies to a further modification, shown with reference to FIGS. 30 and 31, in which the printed circuit board(s) 76 is/are arranged between adjacent semiconductor chips 1 in the free space 211. As shown, the printed circuit board(s) 76 can optionally be adhesively bonded onto the bottom compensation lamina 22 directly by means of an electrically conductive or electrically insulating adhesive 75. For the rest, the electrical interconnection of the bonding wires 72 can be carried out in the manner as already explained with reference to FIGS. 22 to 29. The entire control electrode interconnection structure 70 and thus also the bonding wires 72 can once again be completely arranged in the free space 211 and embedded into the embedding compound 4.

After the electrical connection of the control electrodes 13, the arrangement can be provided with an embedding compound 4a (the latter can form the entire embedding compound 4, or only a part thereof) which cohesively connects the semiconductor chips 1 after curing and which additionally encloses the control electrode interconnection structure 70, such that the control electrode interconnection structure 70 is embedded into the embedding compound 4a or 4. After embedding, the arrangement can once again be ground, such that the top compensation laminae 21 are exposed at their sides facing away from the associated semiconductor chips 1 and can be electrically contacted, which is shown as the result in FIG. 31. The semiconductor chips 1 cohesively connected to one another by means of the embedding compound 4, the top compensation laminae 21 exposed at their sides facing away from the semiconductor chips 1, the embedding compound 4 and also the control electrode interconnection structure 70 are constituents of an assemblage 6.

With regard to FIGS. 23, 25 and 31, it is pointed out that the illustration of the bonding wires 32 is simplified therein insofar as—apart from their cross section—they should actually be hidden by the embedding compound 4. This illustration was nevertheless chosen in order to better illustrate the electrical connections realized by means of the bonding wires 32.

As was explained above, with the use of bonding wires 72 it is possible to employ bonding support point elements, which were embodied as printed circuit boards 76 in the examples shown. Instead of or in addition to printed circuit boards 76, however, a bonding support point element, as a constituent of a control electrode interconnection structure 70, can also comprise any other construction as long as at least two bonding wires 72 can be bonded to the bonding support point element to in each case at least one bonding location. By way of example, a bonding support point element can be embodied as a prefabricated metal lamina.

It is likewise possible to use one or a plurality of functional chips as bonding support point elements. Such functional chips can contain diodes and/or ohmic resistors, for example, which are integrated into the signal path for driving the control electrodes 13 and are thereby connected upstream of the control electrodes 13. It is also possible to use electrical resistance components embodied e.g. as chip resistor (embodied for example on an HTTC substrate; HTTC=High Temperature Cofired Ceramics) or as an SMD resistor or as paste-printed resistor. Furthermore, arbitrary SMD components can be used, e.g. ohmic SMD resistors, SMD diodes, or generally active and/or passive SMD components.

Especially the use of one or a plurality of electrical resistance components makes it possible to connect series resistors (for example gate series resistors) upstream of the individual control electrodes, insofar as this is necessary or desired, in order to adapt the switching behavior of the semiconductor components integrated in the semiconductor chips 1 to requirements which may be given for example by a specific application.

Bonding support point elements can additionally also be used to ensure that an electrical drive signal that is fed to all control electrodes 13 actually reaches the control electrodes 13 simultaneously and with the same signal strength (e.g. the same voltage level) which can take place by means of a corresponding design of the control electrode interconnection structure 70.

The use of bonding wires 72 together with one or a plurality of bonding support point elements affords the advantage that each control electrode 13 or a contact piece 32 applied thereto can be connected directly by means of a bonding wire 72. The use of bonding wires 72 is significantly simpler and as a result more reliable than if, for example, a prefabricated structured sheet is connected in each case by means of a sintered connection to all control electrodes 13 or contact pieces 23.

Using an assemblage 6 comprising two or more (optionally identical) semiconductor chips 1 in which those sides of the top compensation laminae 21 which face away from the semiconductor chips 1 are exposed, it is possible, then, to produce a semiconductor arrangement such as is shown as the result in FIG. 33. FIG. 32 shows an exploded illustration of the finished semiconductor arrangement in accordance with FIG. 33. As is evident from FIGS. 32 and 33, the semiconductor arrangement, also designated as "press pack cell", comprises a housing having an electrically conductive top contact plate 41, an electrically conductive bottom contact plate 42, and also a dielectric spacer ring 50. The assemblage 6 is arranged between the top contact plate 41 and the bottom contact plate 42. The top contact plate 41 serves for electrically and mechanically contacting, from each of the chip assemblies 2, the top compensation lamina 21 facing the top contact plate 41. The bottom contact plate 42 correspondingly serves for electrically and mechanically contacting the bottom compensation lamina 22. The electrical contacting here can be pure pressure contacting in each case, which arises at least if the contact plates 41 and 42 are pressed against one another by a sufficiently large external press-on force.

Suitable materials for the top contact piece 41 and/or the bottom contact piece 42 include copper or a copper alloy, for example. Optionally, the top contact piece 41 and/or the bottom contact piece 42 can be provided with a thin nickel layer. In principle, however, use can also be made of any other electrically conductive materials, in particular metals or metal alloys, for example aluminum or an aluminum alloy or a copper alloy.

The spacer ring 50, which is arranged between the contact plates 41 and 42 and which surrounds the assemblage 5 in a ring-shaped manner, consists of a dielectric material, for example ceramic, in order to electrically insulate the contact plates 41 and 42 from one another. As also in all of the other configurations of the invention, the spacer ring 50 can be connected cohesively, for example by soldering, adhesive bonding or sintering, both to the top contact plate 41 and to the bottom contact plate 42.

As is furthermore shown in FIGS. 32 and 33, a thin, electrically conductive connecting layer 80 can optionally be applied to an assemblage 6 in which those sides of the top compensation laminae 21 which face away from the semiconductor chips 1 are exposed, said connecting layer electrically conductively connecting the top compensation laminae 21 to one another. The connecting layer 80 can be embodied using thin-film technology, for example, by being deposited on the assemblage 6 by means of a deposition method, for example PVD (=physical vapor deposition, e.g. sputtering), CVD (=chemical vapor deposition) or plating. The connecting layer 80 can for example comprise ruthenium or consist of ruthenium, and/or it can e.g. comprise aluminum or consist of aluminum. The connecting layer 80 additionally fulfils the function of a sliding medium during the pressure contacting explained in order to reduce the mechanical stresses that typically arise during the pressure contacting and thus to avoid cracking in the assemblage 6.

In the example in accordance with FIG. 33, the top contact plate 41 with the connecting layer 80 can form a pure electrical pressure contact if the contact plates 41 and 42 are pressed against one another with a sufficient press-on force.

Figure 34:
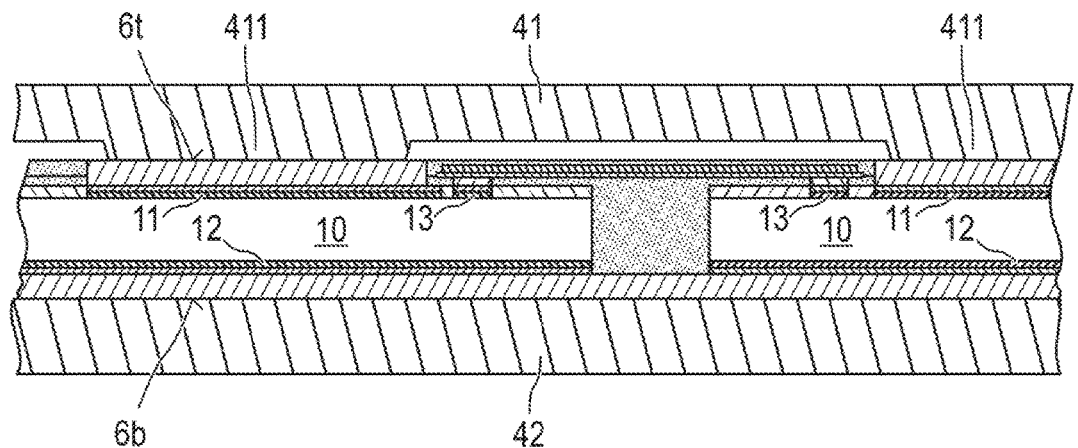
FIG. 34 shows a vertical section through a portion of a press pack cell which comprises a chip assemblage embodied in accordance with FIG. 16.

FIG. 34 shows a modification of the arrangement in accordance with FIGS. 33 and 34 on the basis of an enlarged portion merely by way of example on the basis of the assemblage 6 illustrated in FIG. 16 after the incorporation thereof into a housing having top and bottom contact plates 41 and 42 and a dielectric spacer ring 50 as explained above. For each of the semiconductor chips 1, the top contact plate 41 has, on its side facing the assemblage 6, a dedicated contact projection 411 that subjects one of the top compensation laminae 21 to pressure contacting on that side thereof which faces away from the relevant semiconductor chip 1 if the contact plates 41 and 42 are pressed against one another with a sufficient press-on force. Contact plates 41 having such contact projections 411 can be used, in particular, for all assemblages 6 in which the top compensation laminae 21 are freely accessible, that is to say when they are not covered, or not completely covered, by a connecting layer 80. However, it is also possible to use a contact plate 41 having contact projections 411 in conjunction with an assemblage 6 in which a connecting layer 80 that connects the top compensation laminae 21 covers the top compensation laminae 21. In such cases, a (pure) pressure contact is formed between the connecting layer 80 and each of the contact projections if the contact plates 41, 42 are pressed against one another with a sufficient press-on force.

As has been shown on the basis of the exemplary embodiments explained above, a control electrode interconnection structure 70 can be embedded into the embedding compound 4 and buried therein. In this case, the control electrode interconnection structure 70, on its side facing away from the semiconductor chips 1, can be covered by a portion of the embedding compound 4.

An explanation has been given above, on the basis of various examples, of how a chip assemblage can be constructed or produced wherein a plurality of semiconductor chips 1 are cohesively connected to one another by means of an embedding compound 4. The semiconductor chips 1 can each contain a controllable semiconductor component, for example, wherein an electrical load path is formed between the first main electrode 11 and the second main electrode 12 and wherein an electric current through the electrical load path can be controlled, switched on or switched off by means of a control signal (e.g. an electrical drive potential) being applied to the control electrode 13. In this way, the parallel-connected semiconductor chips 1 or the parallel-connected semiconductor components contained therein can be switched synchronously and in an in-phase manner. In principle, all of the semiconductor chips 1 can be constructed identically, but differently constructed semiconductor chips 1 can also be used.

Suitable controllable semiconductor components are e.g. field effect transistors having an electrically insulated gate, for example MOSFETs (MOSFET=Metal Oxide Semiconductor Field Effect Transistor) or IGBTs (IGBT=Insulated Gate Bipolar Transistor). In these cases, the gate electrodes constitute the control electrodes 13. In the case of MOSFETs, the source electrodes constitute the first main electrodes 11 and the drain electrodes constitute the second main electrodes 12, and, in the case of IGBTs, the emitter electrodes constitute the first main electrodes 11 and the collector electrodes constitute the second main electrodes 12.

Figure 35:
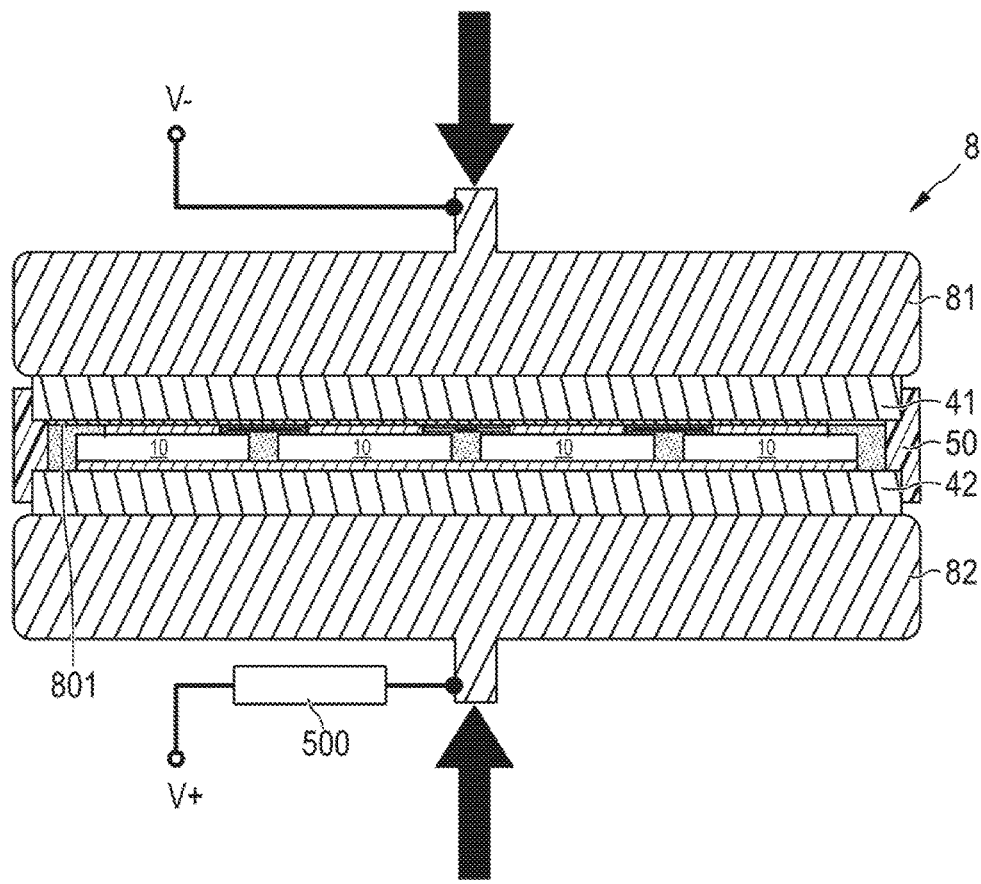
FIG. 35 shows a vertical section through an arrangement wherein a press pack cell is clamped in between two pressure contact pieces and is electrically contacted by the latter in the process.

As is furthermore shown in FIG. 35, a press pack cell with an assemblage 6 such as was explained above can be clamped in between an electrically conductive top pressure contact piece 81 and an electrically conductive bottom pressure contact piece 82 in such a way that there is in each case an electrical pressure contact connection between the top pressure contact piece 81 and the top contact plate 41 and between the bottom pressure contact piece 82 and the bottom contact plate 42.

The pressure contact connections can optionally be pure pressure contact connections. The finished pressure contact arrangement 8 comprising the press pack cell, the top pressure contact piece 81 and the bottom pressure contact piece 82 can then be electrically interconnected. By way of example, the pressure contact arrangement 8 can be connected in series with a resistive and/or inductive load 500 (e.g. an electric motor) between a positive supply potential V+ and a negative supply potential V−.

What is claimed is:

1. A method for producing a chip assemblage, comprising:
producing two or more chip assemblies in each case by cohesively and electrically conductively connecting an electrically conductive first compensation lamina to a first main electrode of a semiconductor chip;
cohesively connecting the chip assemblies by means of a first part of a dielectric embedding compound, wherein the first part of the embedding compound is formed between adjacent first compensation lamina of adjacent chip assemblies and includes a free space that is not filled with the embedding compound, wherein the free space projects downward between the adjacent chip assemblies from a surface of the first part of the embedding compound that is between adjacent first compensation lamina;
arranging a control electrode interconnection structure in the free space between the chip assemblies; and
producing electrically conductive connections between the control electrode interconnection structure and control electrodes of the semiconductor chips of the individual chip assemblies.

2. The method as claimed in claim 1, comprising:
producing openings through the first part of the dielectric embedding compound within the free space in the region of the control electrodes such that the control electrodes are exposed in the respective opening; and
conductively connecting the control electrodes to one another by means of the control electrode interconnection structure through the openings, wherein the control electrode structure is planar and over the openings.

3. The method as claimed in claim 2, wherein the control electrode interconnection structure is electrically conductively connected to the control electrodes by means of an electrically conductive adhesive.

4. The method as claimed in claim 2, wherein the first part is locally removed for the purpose of opening by means of at least one of the following: a laser beam; an etchant.

5. The method as claimed in claim 2, wherein
the control electrodes are exposed directly after the first part has been opened; or
in the case of each of the semiconductor chips its control electrode, at the side thereof facing away from the semiconductor body of said semiconductor chip, is cohesively and electrically conductively connected to an electrically conductive contact piece, wherein the contact pieces are exposed directly after the first part has been opened.

6. The method as claimed in claim 2, wherein the first part is an imide or a molding compound.

7. The method as claimed in claim 2, wherein the control electrode interconnection structure, after the control electrodes have been electrically conductively connected to one another by means of the control electrode interconnection structure, is embedded into a second part of the embedding compound and in the process is covered by the second part.

8. The method as claimed in claim 7, wherein the second part is a molding compound.

9. The method as claimed in claim 1,
wherein the control electrode interconnection structure comprises a plurality of bonding wires and one or more bonding support point elements,
wherein at least one bonding support point element is arranged in the free space between the adjacent chip assemblies, wherein the semiconductor chip in each of the adjacent chip assemblies includes a dielectric passivation layer on a top side, wherein the free space is over the dielectric passivation layer of the semiconductor chip in the adjacent chip assemblies, and wherein each of the control electrodes is electrically conductively connected to a bonding support point element by means of one of the bonding wires.

10. The method as claimed in claim 9, wherein electrically connecting the control electrodes by means of the control electrode interconnection structure is carried out after the semiconductor chips have been cohesively connected to one another by the dielectric embedding compound.

11. The method as claimed in claim 1,
wherein the control electrode interconnection structure comprises a first bonding wire, a second bonding wire and a bonding support point element, wherein the semiconductor chip in each of the adjacent chip assemblies includes a dielectric passivation layer on a top side, wherein the bonding support element is over the dielectric passivation layer of the semiconductor chip in the adjacent chip assemblies, wherein the first bonding wire, the bonding support point element and the second bonding wire are electrically connected in series between a first of the control electrodes and a second of the control electrodes and electrically conductively connect the first and second of the control electrodes to one another, and wherein the first bonding wire and the second bonding wire are bonded in each case directly to the bonding support point element.

12. The method as claimed in claim 11, wherein
the first bonding wire is bonded directly to the first of the control electrodes or directly to a first contact piece, which is arranged on the side of the first of the control electrodes facing away from the associated semiconductor body and is electrically conductively connected to said side; and the second bonding wire is bonded directly to the second of the control electrodes or directly to a second contact piece, which is arranged on the side of the second of the control electrodes facing away from the associated semiconductor body and is electrically conductively connected to said side.

13. The method as claimed in claim 1, wherein each of the first compensation laminae has a coefficient of linear thermal expansion of less than 11 ppm/K or of less than 7 ppm/K at a temperature of 20° C.

14. The method as claimed in claim 1, wherein each of the semiconductor chips comprises a second main electrode, at which it is cohesively and electrically conductively connected to an electrically conductive second compensation lamina.

15. The method as claimed in claim 1, wherein each of the first compensation laminae has a coefficient of linear thermal expansion of less than 11 ppm/K or of less than 7 ppm/K at a temperature of 20° C.

16. The method as claimed in claim 1, wherein the control electrode interconnection structure comprises an element which is firstly prefabricated and then arranged in the free space and subsequently electrically conductively connected to at least one control electrode.

17. The method as claimed in claim 16, wherein the prefabricated element is embodied as
a metal plate; or
a printed circuit board; or
a semiconductor substrate metallized conductively on one or both sides; or
a functional semiconductor chip metallized conductively on one or both sides; or
a glass substrate metallized conductively on one or both sides; or
a ceramic substrate metallized conductively on one or both sides.

18. A method for producing a chip assemblage, comprising:
producing two or more chip assemblies in each case by cohesively and electrically conductively connecting an electrically conductive first compensation lamina to a first main electrode of a semiconductor chip;

arranging a control electrode interconnection structure in a free space between the chip assemblies, wherein the control electrode interconnection structure includes a plurality of bonding wires and one or more bonding support point elements, wherein at least one bonding support point element is arranged in the free space between the chip assemblies;

producing electrically conductive connections between the control electrode interconnection structure and control electrodes of the semiconductor chips of the individual chip assemblies, wherein each of the control electrodes is electrically conductively connected to a bonding support point element by means of one of the bonding wires; and cohesively connecting the chip assemblies by means of a dielectric embedding compound, wherein electrically connecting the control electrodes by means of the control electrode interconnection structure is carried out before the semiconductor chips are cohesively connected to one another by means of the dielectric embedding compound.

19. A method for producing a chip assemblage, comprising:
producing two or more chip assemblies in each case by cohesively and electrically conductively connecting an electrically conductive first compensation lamina to a first main electrode of a semiconductor chip;

arranging a control electrode interconnection structure in a free space between the chip assemblies, wherein the control electrode interconnection structure includes a plurality of bonding wires and one or more bonding support point elements, wherein at least one bonding support point element is arranged in the free space between the chip assemblies;

producing electrically conductive connections between the control electrode interconnection structure and control electrodes of the semiconductor chips of the individual chip assemblies, wherein each of the control electrodes is electrically conductively connected to a bonding support point element by means of one of the bonding wires; and cohesively connecting the chip assemblies by means of a dielectric embedding compound, wherein electrically connecting the control electrodes by means of the control electrode interconnection structure is carried out after the semiconductor chips have been cohesively connected to one another by the dielectric embedding compound, wherein the control electrodes, after the semiconductor chips have been cohesively connected to one another by means of the embedding compound, are covered by the embedding compound, wherein in the embedding compound, before the control electrodes are electrically connected by means of the control electrode interconnection structure, an opening is produced in each case in the region of the control electrodes such that the control electrodes are exposed in the respective opening, and wherein the control electrodes are electrically conductively connected by means of the control electrode interconnection structure through the openings.

* * * * *